(12) United States Patent
Lee

(10) Patent No.: US 11,265,492 B2
(45) Date of Patent: Mar. 1, 2022

(54) POWER CHARACTERISTIC MEASUREMENT DEVICE, IMAGE SYSTEM INCLUDING POWER CHARACTERISTIC MEASUREMENT DEVICE AND OPERATING METHOD OF IMAGE SYSTEM

(71) Applicant: SK hynix Inc., Gyeonggi-do (KR)

(72) Inventor: Jeong-Gon Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/860,752

(22) Filed: Apr. 28, 2020

(65) Prior Publication Data

US 2021/0176415 A1  Jun. 10, 2021

(30) Foreign Application Priority Data

Dec. 5, 2019  (KR) ........................ 10-2019-0160781

(51) Int. Cl.
*H04N 5/369* (2011.01)
*G01R 17/02* (2006.01)
*G01R 27/26* (2006.01)
*H04N 5/232* (2006.01)

(52) U.S. Cl.
CPC ........... *H04N 5/3698* (2013.01); *G01R 17/02* (2013.01); *G01R 27/26* (2013.01); *H04N 5/23241* (2013.01)

(58) Field of Classification Search
CPC .. H04N 5/3698; H04N 5/23241; G01R 17/02; G01R 27/26
See application file for complete search history.

(56) References Cited

U.S. PATENT DOCUMENTS

| | | | |
|---|---|---|---|
| 8,742,736 B2 | 6/2014 | Myers | |
| 9,172,951 B2 * | 10/2015 | Okita | ..................... H04N 5/369 |
| 2012/0187936 A1 | 7/2012 | Myers | |
| 2012/0274752 A1 * | 11/2012 | Hashimoto | ........ A61B 1/00009 |
| | | | 348/65 |
| 2020/0340855 A1 * | 10/2020 | Wang | ........................ H03F 3/45 |
| 2021/0051280 A1 * | 2/2021 | Kumar | ................... H04N 5/357 |
| 2021/0102844 A1 * | 4/2021 | Chan | ...................... G01J 5/024 |

FOREIGN PATENT DOCUMENTS

KR   10-2019-0068923   6/2019

* cited by examiner

*Primary Examiner* — Timothy J Henn
(74) *Attorney, Agent, or Firm* — IP & T Group LLP

(57) ABSTRACT

Disclosed are a power characteristic measurement device, an image system including the power characteristic measurement device and an operating method of the image system, and the power characteristic measurement device may include a comparison circuit suitable for comparing impedance of an image sensor with impedance of a modeled image sensor, and an extraction circuit suitable for extracting the impedance of the image sensor according to a comparison result of the comparison circuit.

19 Claims, 4 Drawing Sheets

POWER CHARACTERISTIC MEASUREMENT DEVICE, IMAGE SYSTEM INCLUDING POWER CHARACTERISTIC MEASUREMENT DEVICE AND OPERATING METHOD OF IMAGE SYSTEM

CROSS-REFERENCE TO RELATED APPLICATION

This application claims priority under 35 U.S.C. § 119 to Korean Patent Application No. 10-2019-0160781, filed on Dec. 5, 2019, the disclosure of which is incorporated herein by reference in its entirety.

BACKGROUND

1. Field

Various embodiments of the present disclosure relate to a semiconductor design technique, and more particularly, to a power characteristic measurement device, an image system including the power characteristic measurement device and an operating method of the image system.

2. Description of the Related Art

Image sensors capture images using the photosensitive property of a semiconductor. Generally, there are two types of image sensors: charge-coupled device (CCD) image sensors and complementary metal-oxide semiconductor (CMOS) image sensors. Recently, CMOS image sensors are widely used because the CMOS image sensors allow both analog and digital control circuits to be directly implemented on a single integrated circuit (IC).

SUMMARY

Various embodiments of the present disclosure are directed to a power characteristic measurement device capable of easily measuring a power characteristic of an image sensor, an image system including the power characteristic measurement device and an operating method of the image system.

In accordance with an embodiment, a power characteristic measurement device may include: a comparison circuit suitable for comparing impedance of an image sensor with impedance of a modeled image sensor; and an extraction circuit suitable for extracting the impedance of the image sensor according to a comparison result of the comparison circuit.

The impedance of the image sensor may include impedance of a power delivery network in the image sensor, and the impedance of the modeled image sensor may correspond to the impedance of the power delivery network.

In accordance with an embodiment, an image system may include: a package including an image sensor; and a power characteristic measurement device on which the package is mounted, and suitable for measuring a power characteristic of the image sensor based on impedance of the image sensor and impedance of a modeled image sensor.

The impedance of the image sensor may include impedance of a power delivery network in the image sensor, and the impedance of the modeled image sensor may correspond to the impedance of the power delivery network.

In accordance with an embodiment, an operating method of an image system may include: establishing an environment for measuring a power characteristic of a first image sensor in a first package; measuring the power characteristic of the first image sensor according to the environment; and measuring a power characteristic of a second image sensor included in a second package, which is different from the power characteristic of the first image sensor, according to the environment when the power characteristic of the first image sensor is normally measured.

The environment may be established to model a power delivery network of the first image sensor and generate impedance of the modeled power delivery network of the first image sensor.

DETAILED DESCRIPTION

Various embodiments are described below in more detail with reference to the accompanying drawings. These embodiments are provided so that this disclosure is thorough and complete, and fully conveys the scope of the present disclosure to those skilled in the art.

It will be understood that when an element is referred to as being "connected to", or "coupled to" another element, it may be directly on, connected to, or coupled to the other element, or one or more intervening elements may be present. In addition, it will also be understood that the terms "comprises," "comprising," "includes," and "including" when used in this specification, specify the presence of the stated elements and do not preclude the presence or addition of one or more other elements. As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form. Also, throughout the specification, reference to "an embodiment" or the like is not necessarily to only one embodiment, and different references to any such phrase are not necessarily to the same embodiment(s).

Figure 1:
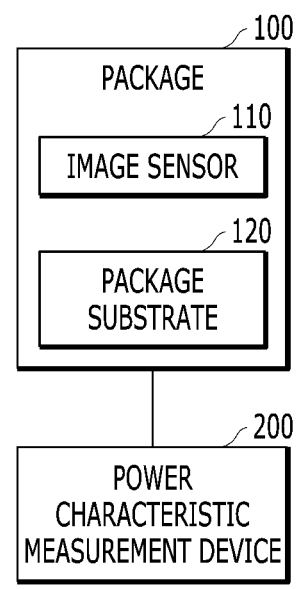
FIG. 1 is a block diagram illustrating an image system in accordance with an embodiment.

FIG. 1 is a block diagram illustrating an image system in accordance with an embodiment.

Referring to FIG. 1, the image system may include a package 100 and a power characteristic measurement device 200.

The package 100 may include an image sensor 110 and a package substrate 120.

The image sensor 110 may be mounted on the package substrate 120 in the form of a chip. For example, the image sensor 110 may include and use a complementary metal-oxide semiconductor (CMOS).

The package substrate 120 is for packaging the image sensor 110. The package substrate 120 serves as a medium through which the image sensor 110 and the power characteristic measurement device 200 are electrically connected to each other.

The power characteristic measurement device 200 may have the package 100 mounted thereon. In other words, the power characteristic measurement device 200 may be electrically connected to the package 100. The power characteristic measurement device 200 may measure a power characteristic of the image sensor 110. The power characteristic of the image sensor 110 may be an impedance of a power delivery network included in the image sensor 110.

Figure 2:
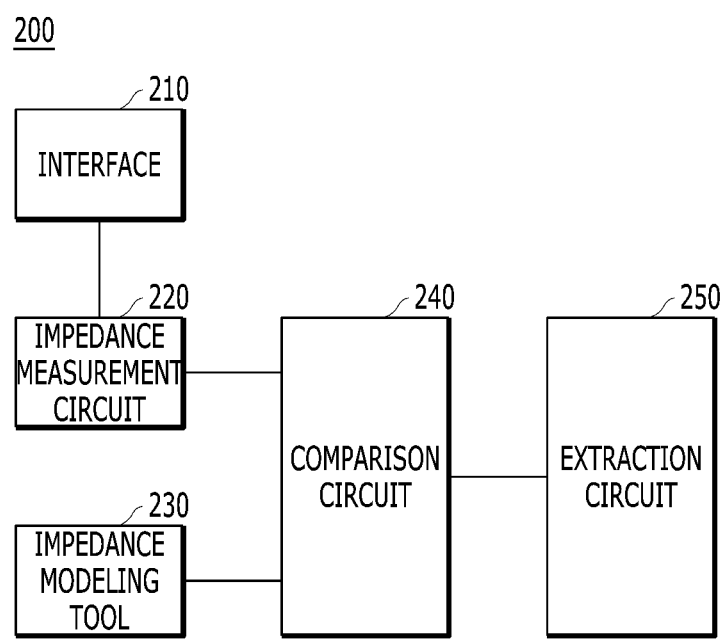
FIG. 2 is a block diagram illustrating a power characteristic measurement device, such as that illustrated in FIG. 1.

FIG. 2 is a block diagram illustrating the power characteristic measurement device 200 illustrated in FIG. 1.

Referring to FIG. 2, the power characteristic measurement device 200 may include an interface 210, an impedance measurement circuit 220, an impedance modeling tool 230, a comparison circuit 240 and an extraction circuit 250.

The interface 210 may have the package 100 mounted thereon. In other words, the interface 210 may be electrically connected to the package 100. For example, the interface 210 may be electrically connected to at least one of pins in the package 100, which is related to power.

The impedance measurement circuit 220 may be electrically connected to the package 100 through the interface 210. The impedance measurement circuit 220 may measure the impedance of the power delivery network in the image sensor 110. Substantially, the impedance measurement circuit 220 may measure overall impedance including impedance of the image sensor 110, impedance of the package substrate 120 and impedance of the interface 210. Accordingly, the impedance measurement circuit 220 may measure only the impedance of the image sensor 110 excluding the impedance of the package substrate 120 and the impedance of the interface 210 by using a de-embedding technique.

The impedance measurement circuit 220 may measure the impedance based on the following Equation 1.

$$Z=\sqrt{(R^2+X^2)}$$ [Equation 1]

Herein, "Z" refers to impedance of the power delivery network in the image sensor 110, "R" refers to resistance in the power delivery network, and "X" refers to reactance in the power delivery network. The reactance includes at least one of capacitive reactance and inductive reactance.

The impedance modeling tool 230 may generate impedance of each of three models. The first model is obtained by modeling the power delivery network of the image sensor 110. The second model is obtained by modeling the package substrate 120, and the third model is obtained by modeling the interface 210.

The first model may include a chip power model. The impedance modeling tool 230 may generate only the impedance of the first model excluding the impedance of the second model and the impedance of the third model, by using the de-embedding technique. For example, the impedance modeling tool 230 may include a computer-aided engineering (CAE) simulation tool.

The comparison circuit 240 may compare the impedance of the power delivery network of the image sensor 110, measured by the impedance measurement circuit 220, with the impedance of the first model generated by the impedance modeling tool 230. As a result of the comparison, when the impedance of the power delivery network of the image sensor 110 and the impedance of the first model are not the same, the impedance measurement circuit 220 and/or the impedance modeling tool 230 may be tuned. For example, the impedance measurement circuit 220 may tune the impedance of the power delivery network of the image sensor 110 by controlling at least one of the resistance, the capacitive reactance and the inductive reactance in the power delivery network. the impedance modeling tool 230 may tune the impedance of the first model by controlling at least one of resistance, capacitive reactance and inductive reactance in the first model.

The comparison may be repeated until the impedance of the power delivery network of the image sensor 110 and the impedance of the first model are the same.

The extraction circuit 250 may extract the impedance of the power delivery network of the image sensor 110 according to the comparison result of the comparison circuit 240. For example, when the impedance of the power delivery network of the image sensor 110 and the impedance of the first model are the same, the extraction circuit 250 may extract the impedance of the power delivery network of the image sensor 110.

Hereinafter, an operating method of the image system having the aforementioned structure is described.

Figure 3:
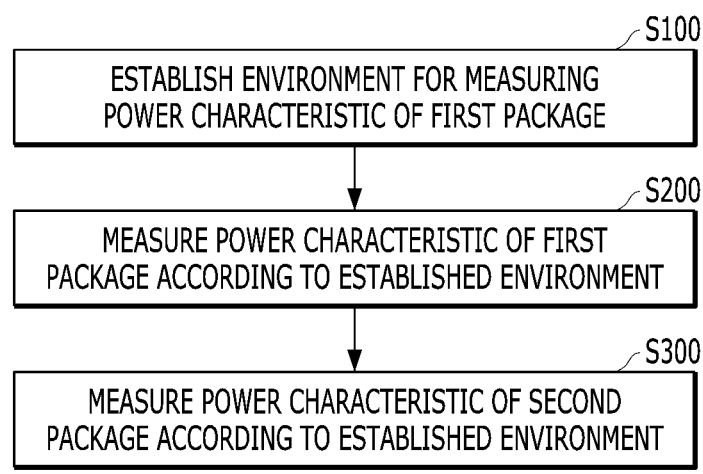
FIG. 3 is a flowchart illustrating an operating method of an image system, such as that illustrated in FIG. 1.

FIG. 3 is a flowchart illustrating the operating method of the image system.

Referring to FIG. 3, the operating method of the image system may include establishing an environment for measuring the power characteristic of the image sensor 110 in the package 100 in step S100, measuring the power characteristic of the image sensor 100 according to the environment in step S200, and measuring a power characteristic of an image sensor in a package different from the package 100, according to the environment, in step S300.

In step S100, the environment is established to model the power delivery network of the image sensor 110 and generate impedance of the modeled power delivery network, which is the first model, by the impedance modeling tool 230.

The measuring of the power characteristic of the image sensor in the package, which is different from the package 100 in step S300, may be performed when the power characteristic of the image sensor 110 is normally measured in step S200. The power characteristic of the image sensor 110 may be regarded as normally measured when the impedance of the power delivery network of the image sensor 110 and the impedance of the first model are the same. That is, the impedance measurement circuit 220 included in the power characteristic measurement device 200 may be regarded to operate normally when the power characteristic of the image sensor 110 is normally measured.

Accordingly, even though the power characteristic of the image sensor, which is included in the package different from the package 100, is different from the power characteristic of the image sensor 110, the impedance of the power delivery network in the image sensor in the different package may be accurately measured based on the impedance of the first model that is generated in step S100.

Figure 4:
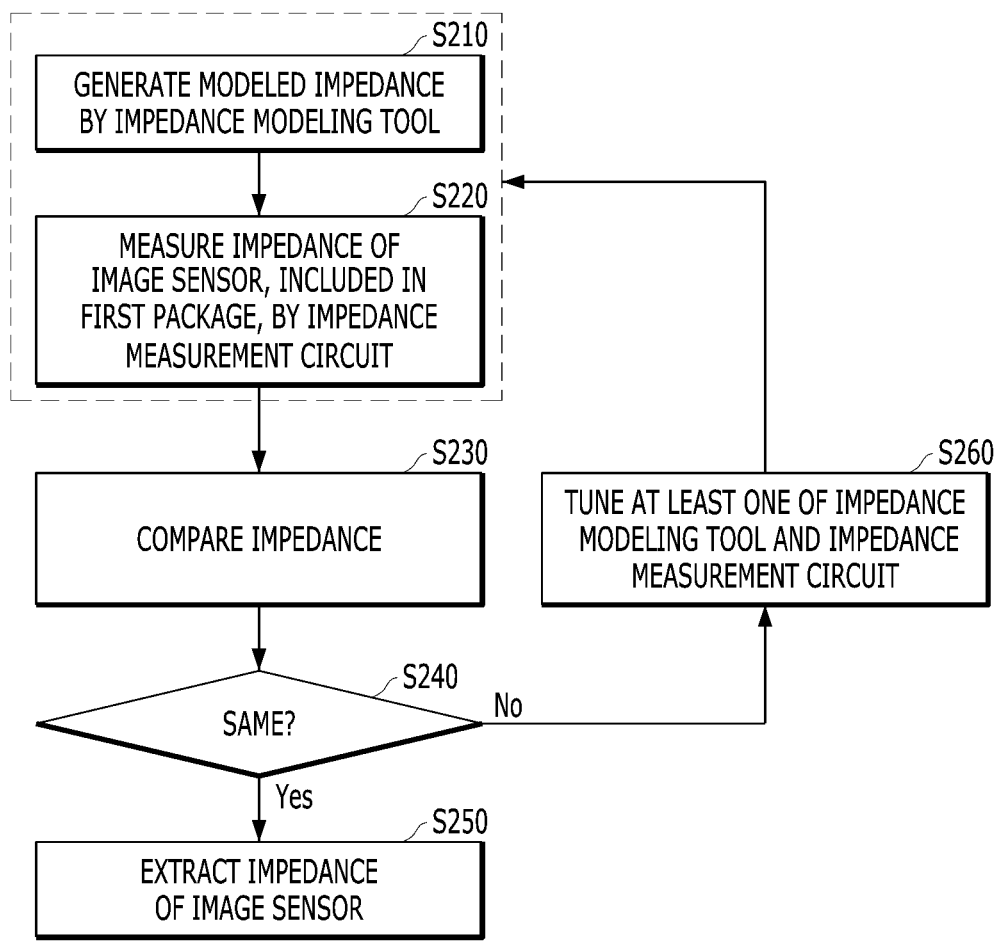
FIG. 4 is a flowchart illustrating a step of measuring a power characteristic of a first image sensor in an operating method of the image system, such as that illustrated in FIG. 3.

FIG. 4 is a flowchart illustrating in detail step S200 of FIG. 3, that is, the measuring of the power characteristic of the image sensor 100.

Referring to FIG. 4, the measuring of the power characteristic of the image sensor 100 in step S200 may include generating the impedance of the first model by the impedance modeling tool 230 in step S210, measuring the impedance of the power delivery network in the image sensor 110 by the impedance measurement circuit 220 in step S220, comparing the impedance of the first model with the impedance of the power delivery network by the comparison circuit 240 in step S230, extracting the impedance of the power delivery network by the extraction circuit 250 in step S250 when the impedance of the first model is the same as the impedance of the power delivery network ("YES" in step S240), and tuning the impedance modeling tool 230 and/or the impedance measurement circuit 220 in step S260 when the impedance of the first model is not the same as the impedance of the power delivery network ("NO" in step S240).

As is apparent from the above description, the impedance of the power delivery network in the image sensor may be measured, thereby easily measuring the power characteristic of the image sensor and even the power characteristic of a heterogeneous image sensor (i.e., the image sensor in the different package).

Embodiments of the present disclosure enable development of a high-quality image sensor based on the power characteristic of the image sensor by easily measuring the power characteristic of the image sensor.

While the present disclosure has been illustrated and described with respect to specific embodiments, the disclosed embodiments are not intended to be restrictive. Further, it is noted that the present disclosure may be achieved in various ways through substitution, change, and modification, as those skilled in the art will recognize in light of the present disclosure, without departing from the spirit and/or scope of the present disclosure. The present disclosure is intended to embrace all such substitutions, changes and modifications that fall within the scope of the following claims.

What is claimed is:

1. A power characteristic measurement device comprising:
    a comparison circuit suitable for comparing impedance of an image sensor with impedance of a modeled image sensor; and
    an extraction circuit suitable for extracting the impedance of the image sensor according to a comparison result of the comparison circuit.

2. The power characteristic measurement device of claim 1,
    wherein the impedance of the image sensor includes impedance of a power delivery network in the image sensor, and
    wherein the impedance of the modeled image sensor corresponds to the impedance of the power delivery network.

3. The power characteristic measurement device of claim 1, further comprising an impedance measurement circuit suitable for measuring the impedance of the image sensor, by using a de-embedding technique.

4. The power characteristic measurement device of claim 1, further comprising an impedance modeling tool suitable for generating the impedance of the modeled image sensor, by using a de-embedding technique.

5. The power characteristic measurement device of claim 4, wherein the impedance modeling tool designs the modeled image sensor based on a chip power model.

6. The power characteristic measurement device of claim 1, further comprising an interface on which a package including the image sensor is mounted,
    wherein the package and the impedance measurement circuit are electrically connected through the interface.

7. An image system comprising:
    a package including an image sensor; and
    a power characteristic measurement device on which the package is mounted, and suitable for measuring a power characteristic of the image sensor based on impedance of the image sensor and impedance of a modeled image sensor.

8. The image system of claim 7,
    wherein the impedance of the image sensor includes impedance of a power delivery network in the image sensor, and
    wherein the impedance of the modeled image sensor corresponds to the impedance of the power delivery network.

9. The image system of claim 7, wherein the power characteristic measurement device extracts the impedance of the image sensor from impedance of the package, by using a de-embedding technique.

10. The image system of claim 7, wherein the modeled image sensor is designed based on a chip power model.

11. The image system of claim 7, wherein the power characteristic measurement device includes:
    an interface on which the package is mounted;
    an impedance measurement circuit electrically connected to the package through the interface, and suitable for measuring the impedance of the image sensor;
    an impedance modeling tool suitable for generating the impedance of the modeled image sensor;
    a comparison circuit suitable for comparing the impedance of the image sensor with the impedance of the modeled image sensor; and
    an extraction circuit suitable for extracting the impedance of the image sensor according to a comparison result of the comparison circuit.

12. The image system of claim 11, wherein the impedance measurement circuit measures the impedance of the image sensor, except for impedance of a package substrate in the package and impedance of the interface, by using a de-embedding technique.

13. The image system of claim 11, wherein the impedance modeling tool generates the impedance of the modeled image sensor, except for impedance of a modeled package substrate and impedance of a modeled interface, by using a de-embedding technique.

14. An operating method of an image system, comprising:
    modeling a power characteristic of a first image sensor in a first package and generating impedance of the modeled power delivery network of the first image sensor;
    measuring the power characteristic of the first image sensor according to the impedance of the modeled power delivery network of the first image sensor; and
    measuring a power characteristic of a second image sensor included in a second package, which is different from the power characteristic of the first image sensor, according to the impedance of the modeled power delivery network of the first image sensor when the power characteristic of the first image sensor is normally measured.

15. The operating method of claim 14, wherein the measuring of the power characteristic of the first image sensor is carried out when impedance of the power delivery network of the first image sensor is the same as the impedance of the modeled power delivery network of the first image sensor.

16. The operating method of claim 14, wherein the power characteristic of the second image sensor is measured based on impedance of a power delivery network in the second image sensor and the impedance of the modeled power delivery network of the first image sensor.

17. The operating method of claim 14, wherein the measuring of the power characteristic of the first image sensor includes:
    generating, by an impedance modeling tool, impedance of a modeled first image sensor;

measuring, by an impedance measurement circuit, impedance of the first image sensor;

comparing, by a comparison circuit, the impedance of the modeled first image sensor with the impedance of the first image sensor; and extracting, by an extraction circuit, the impedance of the first image sensor when the impedance of the modeled first image sensor is the same as the impedance of the first image sensor.

18. The operating method of claim 17, further comprising tuning at least one of the impedance modeling tool and the impedance measurement circuit when the impedance of the modeled first image sensor is not the same as the impedance of the first image sensor.

19. The operating method of claim 17, wherein the impedance of the first image sensor includes impedance of a power delivery network in the first image sensor, and the impedance of the modeled first image sensor includes impedance of a modeled power delivery network of the first image sensor.

\* \* \* \* \*